United States Patent [19]
Devore et al.

[11] Patent Number: 5,432,741
[45] Date of Patent: Jul. 11, 1995

[54] CIRCUIT FOR PERMANENTLY DISABLING EEPROM PROGRAMMING

[75] Inventors: Joseph Devore; Andrew Marshall, both of Dallas, Tex.

[73] Assignee: Texas Instruments Incorporated, Dallas, Tex.

[21] Appl. No.: 210,205

[22] Filed: Mar. 17, 1994

[51] Int. Cl.6 .............................................. G11C 11/34
[52] U.S. Cl. ..................... 365/185; 365/182; 365/189.05; 365/189.12; 365/239; 365/240
[58] Field of Search ................. 365/182, 185, 189.12, 365/189.05, 239, 240, 195

[56] References Cited

U.S. PATENT DOCUMENTS 5,283,759  2/1994  Smith ............................ 365/185

Primary Examiner—Joseph A. Popek
Assistant Examiner—F. Niranjan
Attorney, Agent, or Firm—Christopher L. Maginniss; W. James Brady, III; Richard L. Donaldson

[57] ABSTRACT

A circuit for programming an EEPROM 42 which is used to provide trim adjustment for an integrated circuit (IC). The programming circuit provides the capability of programming the EEPROM 42 indefinitely, employing interfaces which are available even after the IC is packaged and encapsulated. Furthermore, it provides the manufacturer or enduser the capability of disabling the programming function permanently, to thereby prevent any inadvertent modifications of the EEPROM 42 data. The programming circuit includes a one-bit EEPROM 32, a nonvolatile memory element which retains its programmed logic state whether or not it is powered up. EEPROM 32 is set during final probe test by the application of a voltage to a probe pad 30 coupled to its set input terminal. Probe pad 30 is exposed such that it may be contacted by a probe prior to IC encapsulation, but is inaccessible after encapsulation. So long as EEPROM 32 is set, EEPROM 42 may be modified upon receipt of a unique address from the system data bus followed by programming data for EEPROM 42. When EEPROM 32 is reset, the programming function of EEPROM 42 is permanently disabled. In a first embodiment, EEPROM 32 is reset by setting a predetermined one of the EEPROM 42 bits to a specified logic state. In a second embodiment, EEPROM 32 is reset by the receipt of another unique address decode from the system data bus.

25 Claims, 2 Drawing Sheets

CIRCUIT FOR PERMANENTLY DISABLING EEPROM PROGRAMMING

TECHNICAL FIELD OF THE INVENTION

The present invention relates generally to integrated electronic circuits and, more particularly, to an EEPROM used in an integrated circuit product, the EEPROM incorporating a programming circuit which prevents inadvertent reprogramming by the product user.

BACKGROUND OF THE INVENTION

Many integrated circuit (IC) products require an adjustment, or trim, after the IC wafer has been completely fabricated. One such example might be a power regulator IC in which the output of a reference voltage generator, required to conform to a particular specification, may be affected by unavoidable manufacturing variations, and thus cannot be precisely determined until after the fabrication process is complete. In this case, the IC may include an array of elements coupled to the input terminals of a digital-to-analog (D/A) converter. Each of these elements may be programmed to one or the other of the logic voltage levels of the D/A converter, so as to generate the desired output voltage at its output terminal. Another such example might be an IC including an oscillator, wherein a post-fabrication trim of its output signal frequency is required.

In the past, these programmable arrays of elements have included zener diodes and polysilicon fuses. During final probe test of each IC die of a wafer, the trim process requires a large current to be applied through selective elements of the array, via probes contacting pads on the die, to permanently alter the states of the selected elements. In the case of an array of zener diodes, the current causes the diode to become a conductive path; in the case of an array of polysilicon fuses, the current causes the fuse to become an open circuit.

This arrangement suffers from several disadvantages. Probe contact pads are required for each element of the array, wasting valuable surface area of the die. Second, programming of the a-ray must occur during probe test, prior to the processes in which the die is packaged and encapsulated, which processes may induce physical stresses in the die which affect its circuit parameters. This prompts a further disadvantage that the trim must be done by the manufacturer, and cannot be performed by the end-user of the IC product. Fourth, both types of elements used in the abovementioned arrays have been known to revert, over time, to their previous state, thereby altering the trim value. Finally, and most significantly, once programmed, the arrays of diodes and fuses cannot be readjusted, making the test program trim routine complex, requiring the use of extrapolation techniques to determine a trim pattern. If the trim is incorrect or drifts out of specification during a later processing step in the IC fabrication, the device may have to be scrapped.

Integrated circuit products having Electrically Erasable Programmable Read-Only Memories (EEPROM's) have been used for many years. In most of these applications, the EEPROM has functioned as a storage medium, e.g., as a reconfigurable look-up table. More recently, however, new uses for EEPROM's have been developed including the trim features of an IC discussed earlier.

The use of an EEPROM to provide trim for an IC offers many advantages over the previously mentioned methods. Since it does not require a multiplicity of probe pads on the die surface, it takes up less area of the IC die and it requires, at most, only one additional lead external to the die. Additionally, aside from actual reprogramming, it does not tend to revert back to a previous state, as can be the case for zener diodes and polysilicon fuses. Finally, and perhaps most significantly, it offers the advantage of reprogrammability; it can be adjusted indefinitely until a satisfactory trim value is achieved.

This reprogrammability feature, however, can be a disadvantage under certain circumstances. It has been recognized that if the EEPROM device can be programmed after encapsulation to provide the proper trim, then it can also be inadvertently reprogrammed to some unwanted value by the end-user. In some cases, where the manufacturer determines the trim adjustment, it is desired to keep the end-user from altering this adjustment. In other cases, it is the end-user who makes the adjustment, but desires that once the adjustment is made, it cannot be reprogrammed.

In the prior art, an external "program enable" lead has been provided which is then tied off to some reference potential when the IC is mounted on a circuit board, thereby disabling the programming function of the EEPROM. This arrangement, however, is not foolproof, and the possibility of inadvertent reprogramming of the EEPROM always exists.

In view of the above, it is clear that there exists a need for an improved apparatus for providing IC trim which incorporates the many advantages of an EEPROM, but which permanently disables its programming function once a satisfactory trim value has been achieved.

SUMMARY OF THE INVENTION

In accordance with the principles of the present invention, there is disclosed herein a programming circuit for an electrically erasable programmable read-only memory (EEPROM). The programming circuit comprises data input means for providing input data to the EEPROM and for providing addressing information. The programming circuit also comprises a nonvolatile storage element capable of existence in a first state, characterized by a first output voltage, or in a second state, characterized by a second output voltage, the nonvolatile storage element being preset to the first state. Finally, the programming circuit comprises means for resetting the nonvolatile storage element permanently from the first state to the second state, the EEPROM being responsive to the first state of the nonvolatile storage element for storing data received from the data input means.

In accordance with a preferred embodiment of the present invention, the programming circuit further comprises a probe pad coupled to the nonvolatile storage element, the probe pad being accessible during an initial fabrication process and being inaccessible thereafter, wherein the nonvolatile storage element is preset to the first state by the application of a potential to the probe pad during the initial fabrication process.

Further in accordance with the present invention there is disclosed an integrated circuit including means for providing trim adjustment data to a functional portion thereof. The integrated circuit comprises an electrically erasable programmable read-only memory (EEPROM), the EEPROM providing the trim adjustment data at its output terminals. The integrated circuit also comprises data input means including a shift register responsive to serial input data for providing parallel output data coupled to data input terminals of the EEPROM and for providing addressing information. The integrated circuit further comprises a nonvolatile storage element capable of existence in a first state, characterized by a first output voltage, or in a second state, characterized by a second output voltage, the nonvolatile storage element being preset to the first state. Finally, the integrated circuit comprises means for resetting the nonvolatile storage element permanently from the first state to the second state, the EEPROM being responsive to the first state of the nonvolatile storage element for storing data received from the data input means.

BRIEF DESCRIPTION OF THE DRAWING

The foregoing features of the present invention may be more fully understood from the following derailed description, read in conjunction with the accompanying drawings, wherein.

DESCRIPTION OF THE PREFERRED EMBODIMENT

Figure 1:
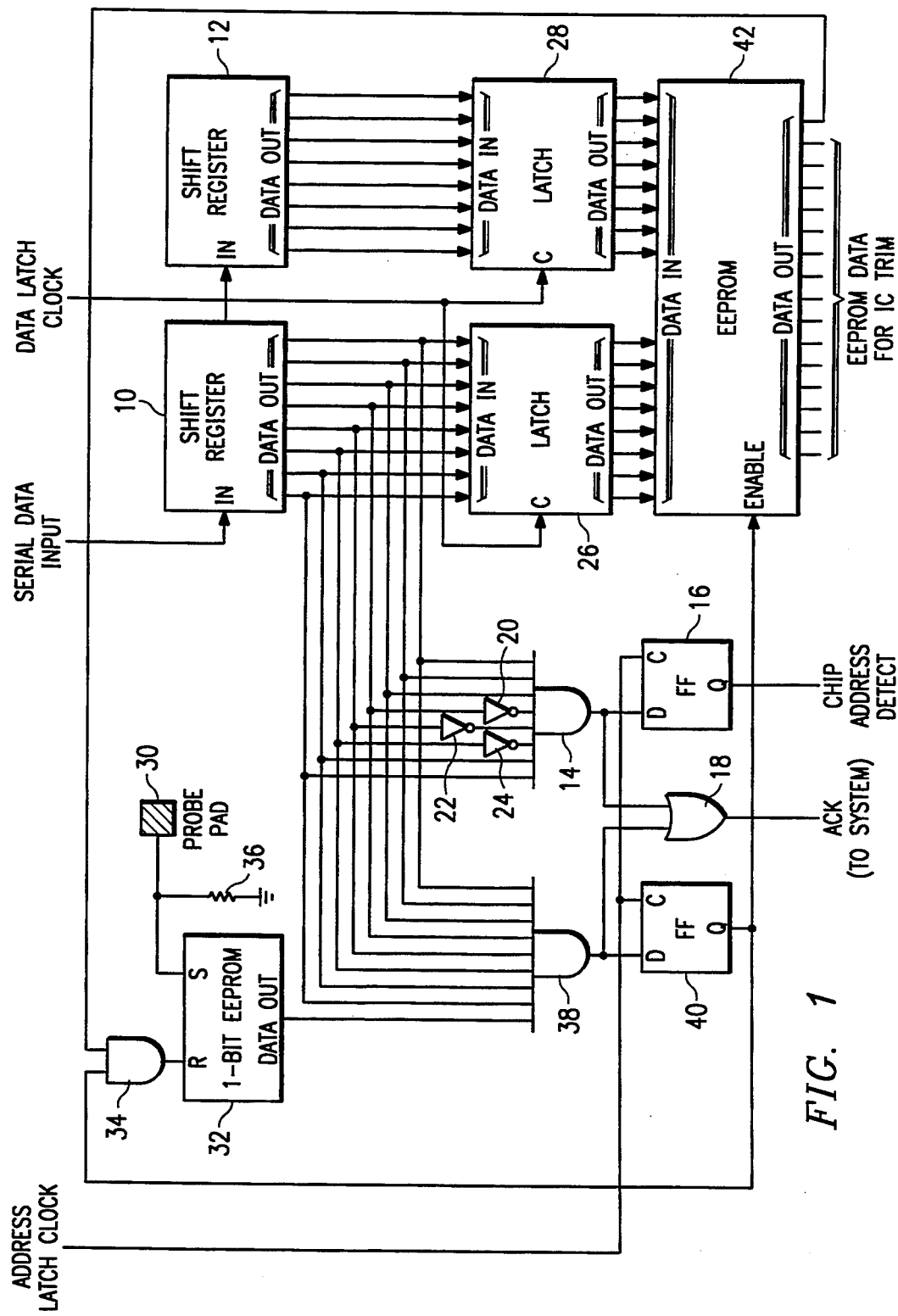
FIG. 1 is a logic diagram of an EEPROM programming circuit in accordance with a first embodiment of the present invention.

Referring to FIG. 1, there is shown a logic diagram of an EEPROM programming circuit in accordance with a first embodiment of the present invention. FIG. 1 depicts elements which may be present on the integrated circuit (IC) chip to interface with the intended functionality of the circuit, viz., shift registers 10 and 12, latches 26 and 28, decode gate 14 (and inverters 20, 22 and 24) and "D" flip-flop 16. FIG. 1 also depicts EEPROM 42 as well as the elements used in its programming, probe pad 30, one-bit EEPROM 32, AND gate 34, decode gate 38 and "D" flip-flop 40.

In this example, a system processor (not shown) controls the function of the IC via four interface signals. These signals include three input signals, a SERIAL DATA INPUT, an ADDRESS LATCH CLOCK and a DATA LATCH CLOCK, and one output acknowledge signal (ACK). During typical operation, the system processor provides a stream of serial data into shift register 10. The data at the DATA OUT terminals of shift register 10 are monitored by an 8-input AND gate 14, which is configured to respond to a specific address which is uniquely assigned to the present IC. In this example, inverters 20, 22 and 24, coupled between the 4th, 5th and 6th DATA OUT signals of shift register 10 and the corresponding inputs of AND gate 14, determine a chip select address of 11000111 for this IC. The output signal from gate 14 is coupled through OR gate 18 to return an acknowledgement (ACK) to the system controller that an IC address has been decoded. The state of the output of decode gate 14 is latched into "D" flip-flop 16 by the ADDRESS LATCH CLOCK signal.

Following the eight bits of address data on the SERIAL DATA INPUT signal line, the next sixteen bits of data comprise the digital information to be sent to the IC. These data are moved serially into and through shift registers 10 and 12 and, when the data transfer is complete, these data are latched into latches 26 and 28 by the DATA LATCH CLOCK. During system operation, the information at the DATA OUT terminals of latches 26 and 28 forms the data interface from the system processor to the IC.

In accordance with the principles of the present invention, there is provided, in conjunction with the interface between the system processor and the IC, circuitry for programming EEPROM 42 before and/or after encapsulation of the IC, this same circuitry providing the capability for permanently disabling the EEPROM programming feature after encapsulation of the IC.

The programming circuitry includes a one-bit EEPROM 32, which can be set into a logic "1" output state by the application of a high logic level voltage at its set (S) input terminal, and which is reset to its logic "0" output state by the application of a high logic level voltage at its reset (R) input terminal. Since EEPROM 32 is nonvolatile memory, it retains its programmed logic state whether or not it is powered up. However, there is no way to predetermine the initial state of EEPROM 32 when the integrated circuit fabrication process is complete and it is powered up for the first time. Therefore, a conductive probe pad 30 on the surface of the IC is coupled to the set input terminal of EEPROM 32, permitting the device to be forced into its set state by the application of a high logic level voltage on probe pad 30. Probe pad 30 is exposed such that it may be contacted by a probe prior to IC encapsulation, but it is inaccessible after encapsulation. Resistor 36, which may illustratively have a value of 1KΩ, coupled between the set input terminal of EEPROM 32 and ground, ensures that the set input terminal is held at a logic low level when there is no voltage applied to probe pad 30. AND gate 34 is coupled at its output terminal to the reset input terminal of EEPROM 32.

The signal at the DATA OUT terminal of EEPROM 32 is coupled as a first input to a 9-input AND gate 38, with the remaining eight inputs being configured as a decode of the information at the eight DATA OUT terminals of shift register 10. AND gate 38 responds to a specific address which is uniquely assigned for enabling the programming of EEPROM 42. In the present example, in order to minimize components, a programming enable address of all 1's (11111111) has been selected for this embodiment. The only limitation on this address is that it must be different from the chip select address (11000111) for this IC. There is no need to be concerned about the possibility of a conflict between the EEPROM programming enable address of the present IC and the chip select address of any other IC in the system, since all EEPROM programming is completed prior to any system operations, and decode gate 38 is then disabled after EEPROM 32 has been reset to its "0" state. The output signal from gate 38 is coupled through OR gate 18 to return an acknowledgement (ACK) to the system controller that the EEPROM programming enable address has been decoded. The state of the output of decode gate 38 is latched into "D" flip-flop 40 by the ADDRESS LATCH CLOCK signal.

Following the eight bits of address data on the SERIAL DATA INPUT signal line, the next sixteen bits of data comprise the digital information to be programmed into EEPROM 42. These data are moved serially into and through shift registers 10 and 12 and, when the data transfer is complete, these data are latched into latches 26 and 28 by the DATA LATCH CLOCK. With the ENABLE input of EEPROM 42 set to a logic high level by the signal at the Q output terminal of flip-flop 40, the data in latches 26 and 28 are appropriately transferred into EEPROM 42.

Fifteen of the sixteen signals at the DATA OUT terminals of EEPROM 42 are available to function as IC trim values; the sixteenth, shown in this example in the least significant bit position, is reserved as a programming reset function. The least significant DATA OUT signal from EEPROM 42 is applied as a first input to AND gate 34 and the signal at the Q output terminal of flip-flop 40 is applied as the second input to AND gate 34, such that if the least significant bit of EEPROM 42 data is a logic "1" during the EEPROM programming mode, EEPROM 32 will be reset, disabling all further programming of EEPROM 42. If, at this time, the IC is encapsulated and probe pad 30 is inaccessible, it will no longer be possible to alter the data in EEPROM 42.

The procedure for programming EEPROM 42 while encapsulated within an integrated circuit package actually begins prior to the encapsulation process. When the IC which includes EEPROM 42 is tested at the final probe test stage, a stage at which the integrated circuit dice are still joined as a wafer, the circuit on each die is powered up and a probe is brought into contact with probe pad 30. In the present example, the probe applies a high logic level voltage, causing the one-bit EEPROM 32 to be put into a set state. If desired, programming of EEPROM 42 can be done at this stage. Later, when the IC is encapsulated and probe pad 30 is no longer accessible, EEPROM 42 may still be reprogrammed indefinitely using the programming enable address followed by EEPROM 42 data across the SERIAL DATA INPUT interface, so long as each programming operation includes a logic "0" as the least significant bit of EEPROM 42 data. When the final circuit trim value of data for EEPROM 42 is established, EEPROM programming may be disabled by including a logic "1" as the least significant bit of EEPROM 42 data, thereby resetting one-bit EEPROM 32, and preventing any further reprogramming of EEPROM 42.

It should be realized that the parameters of the foregoing embodiment are for illustration only, and are not to be construed as a limitation on the invention. The essence of the invention lies in the concept of a nonvolatile memory device within the programming circuit which may be preset to a first state, thereby enabling the programming, and which, after it has been reset to a second state, cannot be restored to its first state.

Figure 2:
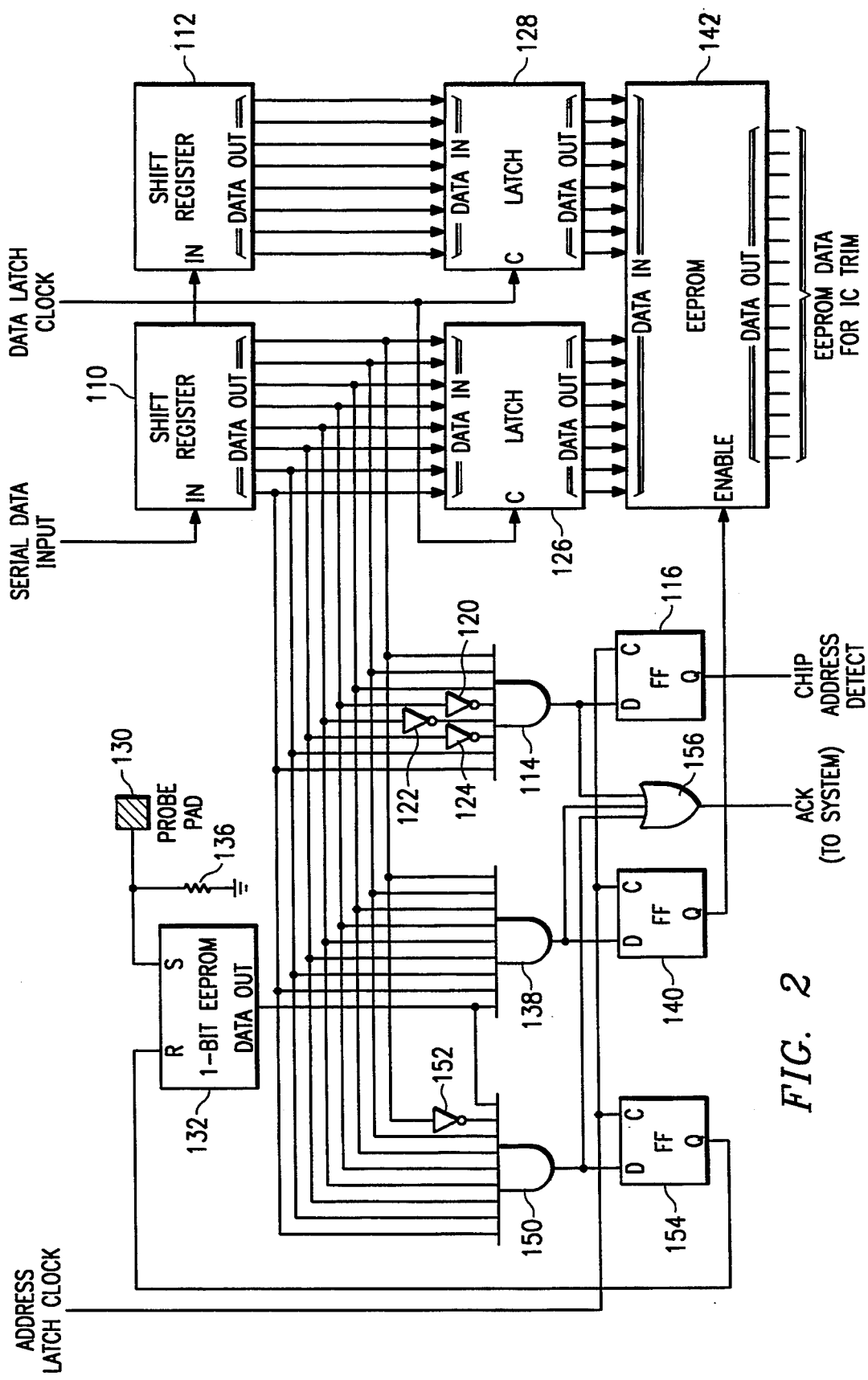
FIG. 2 is a logic diagram of an EEPROM programming circuit in accordance with a second embodiment of the present invention.

Referring now to FIG. 2, there is shown a logic diagram of an EEPROM programming circuit in accordance with a second embodiment of the present invention. Where elements of FIGS. 1 and 2 have numerical designators which differ only in the hundreds place, it is intended that these pairs of elements are similar or substantially identical in the two embodiments.

From the earlier discussion, it is seen that the embodiment of FIG. 1 uses one of the sixteen data bits of EEPROM 42, in conjunction with the programming address decode, to reset program bit EEPROM 32. After programming of EEPROM 42 is complete, this sixteenth data bit serves no function. However, it may be desirable to employ the full sixteen bits of EEPROM 42 data to provide the circuit trim function. The embodiment of FIG. 2 allows this expanded capability by providing a separate device address decode to be used exclusively to reset the program bit EEPROM.

The EEPROM programming circuit of FIG. 2 includes a second 9-input AND gate 150, coupled at a first input terminal thereof to the signal at the DATA OUT terminal of EEPROM 132, with the remaining eight inputs being configured as a decode of the information at the eight DATA OUT terminals of shift register 110, in conjunction with inverter 152. AND gate 150 responds to a specific address which is uniquely assigned for disabling the programming of EEPROM 142. In the present example, a programming disable address of 11111110 has been selected for this embodiment. The only limitation on this address is that it must be different from the chip select address (11000111) and the EEPROM programming enable address (11111111). Again, there is no need to be concerned about the possibility of a conflict between the EEPROM programming disable address of the present IC and the chip select address of any other IC in the system, since all EEPROM programming is completed prior to any system operations. The output signal from gate 150 is coupled through a 3-input OR gate 156 to return an acknowledgement (ACK) to the system controller that the EEPROM programming disable address has been decoded. The state of the output of decode gate 150 is latched into "D" flip-flop 154 by the ADDRESS LATCH CLOCK signal.

The signal at the Q output terminal of flip-flop 154 is applied to the reset input terminal of EEPROM 132, so that if the EEPROM programming disable address (11111110) is generated out of shift register 110 during the EEPROM programming mode, EEPROM 132 will be reset, disabling all further programming of EEPROM 142. If, at this time, the IC is encapsulated and probe pad 130 is inaccessible, it will no longer be possible to alter the data in EEPROM 142.

An illustrative procedure for programming EEPROM 142 while encapsulated within an integrated circuit package is very similar to the procedure described in relation to the embodiment of FIG. 1, except, as noted above, the major difference being the procedure for resetting the one-bit EEPROM 132. In this case, when the final circuit trim value of data for EEPROM 142 is established, EEPROM programming may be disabled by generating the EEPROM programming disable address (11111110) from the SERIAL DATA INPUT signal into shift register 110, thereby enabling a high logic level signal at the output terminal of AND gate 150. This signal is latched into flip-flop 154 upon the occurrence of the ADDRESS LATCH CLOCK signal, and the high logic level signal from its Q output terminal effects the resetting of one-bit EEPROM 132 and prevents any further reprogramming of EEPROM 142.

The present invention, as embodied in the EEPROM programming circuits and methods which are described above and illustrated in FIGS. 1 and 2, overcomes certain limitations and deficiencies of the prior art approaches. It accommodates in-package programming of the EEPROM using pins accessible to the final user, thereby permitting voltage or frequency trim adjustments to compensate for stresses in the package, which are known to cause errors between probe and final testing. Once a satisfactory program value for the EEPROM trim has been achieved, the programming function may be completely disabled, providing the assurance that no further access is available to accidentally or inadvertently modify the EEPROM data. Hence, for an integrated circuit product incorporating EEPROM trim features of the type envisioned here, the approach in accordance with the present invention provides significant advantages.

While the principles of the present invention have been demonstrated with particular regard to the structure and method disclosed herein, it will be recognized that various departures may be undertaken in the practice of the invention. As an example, whereas the illustrative embodiments describe a functional IC product including an EEPROM used to provide a trim value, it will be recognized by one of skill in the art to which it pertains that the principles of the present invention apply equally to an EEPROM IC used solely, as addressable memory. The scope of the invention is not intended to be limited to the particular structure and method disclosed herein, but should instead be gauged by the breadth of the claims which follow.

What is claimed is:

1. A programming circuit for an electrically erasable programmable read-only memory (EEPROM) comprising:
   data input means for providing input data to said EEPROM and for providing addressing information;
   a nonvolatile storage element capable of existence in a first state, characterized by a first output voltage, or in a second state, characterized by a second output voltage, said nonvolatile storage element being preset to said first state; and
   means for resetting said nonvolatile storage element permanently from said first state to said second state, said resetting means being responsive to means for decoding a first address provided by said data input means,
   said EEPROM being responsive to said first state of said nonvolatile storage element for storing data received from said data input means.

2. The programming circuit in accordance with claim 1 wherein said EEPROM is additionally responsive to said means for decoding a first address provided by said data input means for storing data received from said data input means.

3. The programming circuit in accordance with claim 1 wherein said EEPROM is additionally responsive to means for decoding a second address provided by said data input means for storing data received from said data input means.

4. The programming circuit in accordance with claim 1 wherein said resetting means is additionally responsive to the data stored in said EEPROM.

5. The programming circuit in accordance with claim 1 wherein said nonvolatile storage element comprises a one-bit EEPROM.

6. The programming circuit in accordance with claim 1 further including a probe pad coupled to said nonvolatile storage element, said probe pad being accessible during an initial fabrication process and being inaccessible thereafter.

7. The programming circuit in accordance with claim 6 wherein said nonvolatile storage element is preset to said first state by the application of a potential to said probe pad during said initial fabrication process.

8. The programming circuit in accordance with claim 1 wherein said data input means comprises shift register means responsive to serial input data for providing parallel output data.

9. The programming circuit in accordance with claim 1 wherein the parallel output data provided by said shift register means is coupled to data input terminals of said EEPROM.

10. Apparatus for providing trim adjustment data to a circuit, said apparatus comprising:
    an electrically erasable programmable read-only memory (EEPROM), said EEPROM providing said trim adjustment data at its output terminals;
    data input means for providing input data to said EEPROM and for providing addressing information;
    a nonvolatile storage element capable of existence in a first state, characterized by a first output voltage, or in a second state, characterized by a second output voltage, said nonvolatile storage element being preset to said first state; and
    means for resetting said nonvolatile storage element permanently from said first state to said second state, said resetting means being responsive to means for decoding a first address provided by said data input means,
    said EEPROM being responsive to said first state of said nonvolatile storage element for storing data received from said data input means.

11. The apparatus in accordance with claim 10 wherein said EEPROM is additionally responsive to said means for decoding a first address provided by said data input means for storing data received from said data input means.

12. The apparatus in accordance with claim 10 wherein said EEPROM is additionally responsive to means for decoding a second address provided by said data input means for storing data received from said data input means.

13. The apparatus in accordance with claim 10 wherein said resetting means is additionally responsive to the data stored in said EEPROM.

14. The apparatus in accordance with claim 10 wherein said nonvolatile storage element comprises a one-bit EEPROM.

15. The apparatus in accordance with claim 10 further including a probe pad coupled to said nonvolatile storage element, said probe pad being accessible during an initial fabrication process and being inaccessible thereafter.

16. The apparatus in accordance with claim 15 wherein said nonvolatile storage element is preset to said first state by the application of a potential to said probe pad during said initial fabrication process.

17. The apparatus in accordance with claim 10 wherein said data input means comprises shift register means responsive to serial input data for providing parallel output data.

18. The apparatus in accordance with claim 10 wherein the parallel output data provided by said shift register means is coupled to data input terminals of said EEPROM.

19. An integrated circuit including means for providing trim adjustment data to a functional portion thereof, said integrated circuit comprising:
    an electrically erasable programmable read-only memory (EEPROM), said EEPROM providing said trim adjustment data at its output terminals;
    data input means including a shift register responsive to serial input data for providing parallel output data coupled to data input terminals of said EEPROM and for providing addressing information;

a nonvolatile storage element capable of existence in a first state, characterized by a first output voltage, or in a second state, characterized by a second output voltage, said nonvolatile storage element being preset to said first state; and means for resetting said nonvolatile storage element permanently from said first state to said second state, said resetting means being responsive to means for decoding a first address provided by said data input means, said EEPROM being responsive to said first state of said nonvolatile storage element for storing data received from said data input means.

20. The integrated circuit in accordance with claim 19 wherein said EEPROM is additionally responsive to said means for decoding a first address provided by said data input means for storing data received from said data input means.

21. The integrated circuit in accordance with claim 19 wherein said EEPROM is additionally responsive to means for decoding a second address provided by said data input means for storing data received from said data input means.

22. The integrated circuit in accordance with claim 19 wherein said resetting means is additionally responsive to the data stored in said EEPROM.

23. The integrated circuit in accordance with claim 19 wherein said nonvolatile storage element comprises a one-bit EEPROM.

24. The integrated circuit in accordance with claim 19 further including a probe pad coupled to said nonvolatile storage element, said probe pad being accessible during an initial fabrication process and being inaccessible thereafter.

25. The integrated circuit in accordance with claim 24 wherein said nonvolatile storage element is preset to said first state by the application of a potential to said probe pad during said initial fabrication process.

* * * * *